US009685509B2

(12) United States Patent
Kittl et al.

(10) Patent No.: US 9,685,509 B2
(45) Date of Patent: Jun. 20, 2017

(54) FINFET DEVICES INCLUDING HIGH MOBILITY CHANNEL MATERIALS WITH MATERIALS OF GRADED COMPOSITION IN RECESSED SOURCE/DRAIN REGIONS (71) Applicant: Samsung Electronics Co., Ltd., Suwon-si (KR)

(72) Inventors: Jorge A. Kittl, Round Rock, TX (US); Mark S. Rodder, Dallas, TX (US); Robert C. Bowen, Mount Laurel, NJ (US)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/226,518

(22) Filed: Mar. 26, 2014

(65) Prior Publication Data
US 2015/0035008 A1 Feb. 5, 2015

Related U.S. Application Data (60) Provisional application No. 61/859,932, filed on Jul. 30, 2013, provisional application No. 61/859,922, filed on Jul. 30, 2013.

(51) Int. Cl.
*H01L 29/08* (2006.01)
*H01L 29/66* (2006.01)
*H01L 29/78* (2006.01)

(52) U.S. Cl.
CPC ........ *H01L 29/086* (2013.01); *H01L 29/0878* (2013.01); *H01L 29/66522* (2013.01); *H01L 29/66795* (2013.01); *H01L 29/785* (2013.01)

(58) Field of Classification Search
None
See application file for complete search history.

(56) References Cited

U.S. PATENT DOCUMENTS

| 3,968,272 | A | 7/1976 | Anand |
| 3,995,301 | A | 11/1976 | Magdo |
| 4,394,673 | A | 7/1983 | Thompson et al. |
| 4,554,569 | A | 11/1985 | Tove et al. |
| 4,833,042 | A | 5/1989 | Waldrop et al. |
| 6,774,451 | B2 | 8/2004 | Dubois |
| 7,122,412 | B2 | 10/2006 | Chen et al. |
| 7,170,110 | B2 | 1/2007 | Inoue et al. |
| 7,208,777 | B1 | 4/2007 | Inai et al. |

(Continued)

FOREIGN PATENT DOCUMENTS

| KR | 10-2013-0100362 A | 9/2013 |
| WO | WO 2013/101219 | 7/2013 |

OTHER PUBLICATIONS

International Preliminary Report on Patentability Corresponding to International Application No. PCT/US2015/017111; Date of Mailing: Sep. 1, 2016; 13 Pages.

(Continued)

*Primary Examiner* — Robert Carpenter
(74) *Attorney, Agent, or Firm* — Myers Bigel, P.A.

(57) ABSTRACT

A finFET device can include a high mobility semiconductor material in a fin structure that can provide a channel region for the finFET device. A source/drain recess can be adjacent to the fin structure and a graded composition epi-grown semiconductor alloy material, that includes a component of the high mobility semiconductor material, can be located in the source/drain recess.

16 Claims, 5 Drawing Sheets

(56) References Cited

U.S. PATENT DOCUMENTS

| | | |
|---|---|---|
| 7,238,601 B2 | 7/2007 | Mathew et al. |
| 7,300,837 B2 | 11/2007 | Chen et al. |
| 7,667,271 B2 | 2/2010 | Yu et al. |
| 7,678,652 B2 | 3/2010 | Tsuchiaki |
| 7,755,104 B2 | 7/2010 | Yagishita |
| 7,763,943 B2 | 7/2010 | Pillarisetty et al. |
| 7,977,182 B2 | 7/2011 | Nishi et al. |
| 8,018,787 B2 | 9/2011 | Oh et al. |
| 8,154,025 B2 | 4/2012 | Snyder et al. |
| 8,207,038 B2 | 6/2012 | Cheng et al. |
| 8,278,179 B2 | 10/2012 | Lin et al. |
| 8,294,024 B2 | 10/2012 | Borland et al. |
| 8,313,999 B2 | 11/2012 | Cappellani et al. |
| 8,362,568 B2 | 1/2013 | Lin et al. |
| 8,362,575 B2 | 1/2013 | Kwok et al. |
| 8,378,394 B2 | 2/2013 | Anderson et al. |
| 8,420,464 B2 | 4/2013 | Basker et al. |
| 8,524,562 B2 | 9/2013 | Wang et al. |
| 8,575,023 B2 | 11/2013 | Ohmi et al. |
| 8,592,916 B2 | 11/2013 | Khakifirooz et al. |
| 8,896,066 B2 | 11/2014 | Glass et al. |
| 2003/0102490 A1 | 6/2003 | Kubo et al. |
| 2006/0202266 A1 | 9/2006 | Radosavljevic et al. |
| 2008/0093631 A1 | 4/2008 | Chi et al. |
| 2008/0099850 A1 | 5/2008 | Jeon et al. |
| 2009/0166742 A1 | 7/2009 | Pillarisetty et al. |
| 2009/0315026 A1 | 12/2009 | Jeong et al. |
| 2009/0315185 A1 | 12/2009 | Boyanov et al. |
| 2010/0037941 A1 | 2/2010 | Borland et al. |
| 2011/0169124 A1 | 7/2011 | Grupp et al. |
| 2011/0201165 A1 | 8/2011 | Hoentschel et al. |
| 2012/0132989 A1 | 5/2012 | Haensch et al. |
| 2012/0153387 A1* | 6/2012 | Murthy ............ H01L 21/28512 257/335 |
| 2012/0161321 A1 | 6/2012 | Haverty et al. |
| 2012/0168877 A1 | 7/2012 | Mukherjee et al. |
| 2012/0187490 A1 | 7/2012 | Fried et al. |
| 2012/0193713 A1 | 8/2012 | Kulkarni et al. |
| 2013/0026539 A1 | 1/2013 | Tang et al. |
| 2013/0032860 A1 | 2/2013 | Marino et al. |
| 2013/0105897 A1 | 5/2013 | Bangsaruntip et al. |
| 2013/0154016 A1 | 6/2013 | Glass et al. |
| 2013/0241007 A1 | 9/2013 | Choi et al. |
| 2013/0277752 A1 | 10/2013 | Glass et al. |
| 2013/0285155 A1 | 10/2013 | Glass et al. |
| 2013/0307032 A1 | 11/2013 | Kamineni et al. |
| 2014/0001520 A1 | 1/2014 | Glass et al. |
| 2014/0175603 A1 | 6/2014 | Ananthan et al. |
| 2014/0327142 A1 | 11/2014 | Harrison et al. |

OTHER PUBLICATIONS

Coss et al. "Contact resistance reduction to FinFET source/drain using novel dielectric dipole schottky barrier height modulation method", *IEEE Electron Device Letters*, vol. 32, No. 7, pp. 862-864, Jul. 2011.

del Alamo, Jesus A. "Nanometre-scale electronics with III-V compound semiconductors", *Nature*, Nov. 17, 2011, vol. 479, pp. 317-323.

Hasegawa et al. "Current Transport, Fermi Level Pinning, and Transient Behavior of Group-III Nitride Schottky Barriers", *Journal of the Korean Physical Society*, vol. 55, No. 3, Sep. 2009, pp. 1167-1179.

Hu et al. "Novel contact structures for high mobility channel materials", *Materials Research Society Bulletin*, vol. 36, Feb. 2011, 8 Pages.

Kenney et al. "FinFET Parasitic Resistance Reduction by Segregating Shallow Sb, Ge and As Implants at the Silicide Interface", 2012 *Symposium on VLSI Technology Digest of Technical Papers*, 2012, pp. 17-18.

Ostling et al. "Challenges for 10 nm MOSFET process integration", *Journal of Telecommunications and Information Technology*, Feb. 2007, pp. 25-32.

Tiwari et al. "Empirical fit to band discontinuities and barrier heights in III-V alloy systems", *Applied Physics Letters*, 60:630 (1992).

* cited by examiner

FINFET DEVICES INCLUDING HIGH MOBILITY CHANNEL MATERIALS WITH MATERIALS OF GRADED COMPOSITION IN RECESSED SOURCE/DRAIN REGIONS

CROSS-REFERENCE TO RELATED APPLICATIONS

This application is related to, and claims the priority of U.S. Provisional Application Ser. No. 61/859,932, entitled FINFET WITH RECESSED AND GRADED SOURCE AND DRAIN MATERIAL FOR LOW TOTAL PARASITIC RESISTANCE, filed in the USPTO on Jul. 30, 2013; and of U.S. Provisional Application Ser. No. 61/859,922, entitled FINFET WITH IMPROVED SOURCE AND DRAIN FORMATION FOR LOW TOTAL PARASITIC RESISTANCE, filed in the USPTO on Jul. 30, 2013 and of U.S. Non-Provisional application Ser. No. 14/227,812 filed on Mar. 27, 2014, the entire disclosures of which are incorporated herein by reference.

BACKGROUND

The parasitic series resistance of a finFET device can be an issue in addressing the performance of those devices, particularly when the channel length is reduced. Two components of the total parasitic resistance are the contact resistance between the metal contact and the semiconductor fin, and the spreading resistance of the doped region of the semiconductor fin.

Whether one or the other component is dominant may depend on the barrier height presented by the metal/semiconductor interface. For example, a relatively high barrier height (e.g., 300 meV or more) may result in the total parasitic resistance being dominated by the contact resistance, whereas with a smaller barrier height (on the order of 100 meV or less), the dominant component of the total parasitic resistance may be the spreading resistance.

Parasitic resistance is discussed further, for example, in U.S. Patent Publication numbers 2006/0202266 and 2009/0166742, the disclosures of both of which are incorporated herein by reference in their entireties.

SUMMARY

Embodiments according to the invention can provide finFET devices including high mobility channel materials with materials of graded composition in a recessed source/drain regions and methods of forming the same. Pursuant to these embodiments, a finFET device can include a high mobility semiconductor material in a fin structure that can provide a channel region for the finFET device. A source/drain recess can be adjacent to the fin structure and a graded composition epi-grown semiconductor alloy material, that includes the high mobility semiconductor material, can be located in the source/drain recess.

In some embodiments according to the inventive concept, an uppermost surface of the graded composition epi-grown semiconductor alloy material is recessed below an uppermost surface of the fin structure. In some embodiments according to the inventive concept, the finFET device can further include a source/drain contact recess in the graded composition epi-grown semiconductor alloy material, where the source/drain contact recess has a depth that is limited to a point where beyond which an incremental decrease in the spreading resistance value associated with the horizontal interface is less than an incremental increase in the total resistance.

In some embodiments according to the inventive concept, the finFET device can further include a metal-semiconductor alloy on the uppermost surface of the graded composition epi-grown semiconductor alloy material and a metal on the metal-semiconductor alloy. In some embodiments according to the inventive concept, the graded composition epi-grown semiconductor alloy material can include a high mobility semiconductor material rich composition contacting the high mobility semiconductor material of the fin structure at a channel interface and including a high mobility semiconductor material lean composition in the alloy farthest from the channel interface.

In some embodiments according to the inventive concept, the graded composition epi-grown semiconductor alloy material can include a maximum reduction in an amount of the high mobility semiconductor material in the alloy of about 2% per Angstrom. In some embodiments according to the inventive concept, the high mobility semiconductor material rich composition has a component equal to that of a component of the high mobility semiconductor material in the fin structure and the high mobility semiconductor material lean composition has a component about zero.

In some embodiments according to the inventive concept, the high mobility semiconductor material rich composition has a component within +/−30% of being equal to that of a component in the high mobility semiconductor material in the fin structure and the high mobility semiconductor material lean composition has a component within 0-25% of that of a component of the high mobility semiconductor material.

In some embodiments according to the inventive concept, the graded composition epi-grown semiconductor alloy material can include a decreasing composition of a component of the high mobility semiconductor material as a distance from the channel interface increases. In some embodiments according to the inventive concept, a component of the high mobility semiconductor material in the fin structure comprises Ge or Ga and the graded composition epi-grown semiconductor alloy material comprises SiGe or InGaAs, respectively.

In some embodiments according to the inventive concept, the finFET device can be an N type finFET device having a first composition epi-grown semiconductor alloy material in the source/drain recess, and the finFET device can further include a P type finFET device including a second composition epi-grown semiconductor alloy material in a second source/drain recess.

In some embodiments according to the inventive concept, a finFET device can include a high mobility semiconductor material in a fin structure, providing a channel region for the finFET device. A source/drain recess can be adjacent to the fin structure and a graded composition epi-grown semiconductor alloy material can include a component of the high mobility semiconductor material in the source/drain recess, where the alloy material can have an uppermost surface that is recessed below an uppermost surface of the fin structure, and can include a high mobility semiconductor material rich composition contacting a channel interface and including a high mobility semiconductor material lean composition farthest from the channel interface in the alloy material. A source/drain contact recess can be in the graded composition epi-grown semiconductor alloy material and a metal can be in the source/drain contact recess. In some embodiments according to the inventive concept, the graded composition epi-grown semiconductor alloy material can include a maximum reduction in an amount of the high mobility semiconductor material of about 2% per Angstrom.

In some embodiments according to the inventive concept, a method of forming a finFET device can be provided by forming a fin structure including a high mobility semiconductor material to provide a channel region for the finFET device and forming a source/drain recess, adjacent to the fin structure. A graded composition semiconductor alloy material can be epitaxially formed to include a component of the high mobility semiconductor material in the source/drain recess so that the alloy material includes a high mobility semiconductor material rich composition in contact with the high mobility semiconductor material at a channel interface and includes a high mobility semiconductor material lean composition that is farthest from the channel interface in the alloy material. A metal-semiconductor alloy can be formed with a portion of the alloy that includes the high mobility semiconductor material lean composition and a metal can be formed on the metal-semiconductor alloy.

DESCRIPTION OF EMBODIMENTS ACCORDING TO THE INVENTION

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout.

Example embodiments of the inventive concepts are described herein with reference to cross-sectional illustrations that are schematic illustrations of idealized embodiments and intermediate structures of example embodiments. As such, variations from the shapes of the illustrations as a result, for example, of manufacturing techniques and/or tolerances, are to be expected. Thus, example embodiments of the inventive concepts should not be construed as limited to the particular shapes illustrated herein but include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, integers, steps, operations, elements, and/or components, but do not preclude the presence or addition of one or more other features, integers, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

It will be understood that although the terms first, second, etc. may be used herein to describe various elements, these elements should not be limited by these terms. These terms are only used to distinguish one element from another. Thus, a first element could be termed a second element without departing from the teachings of the present embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may be interpreted accordingly.

Figures 1A, 1B, 1C:
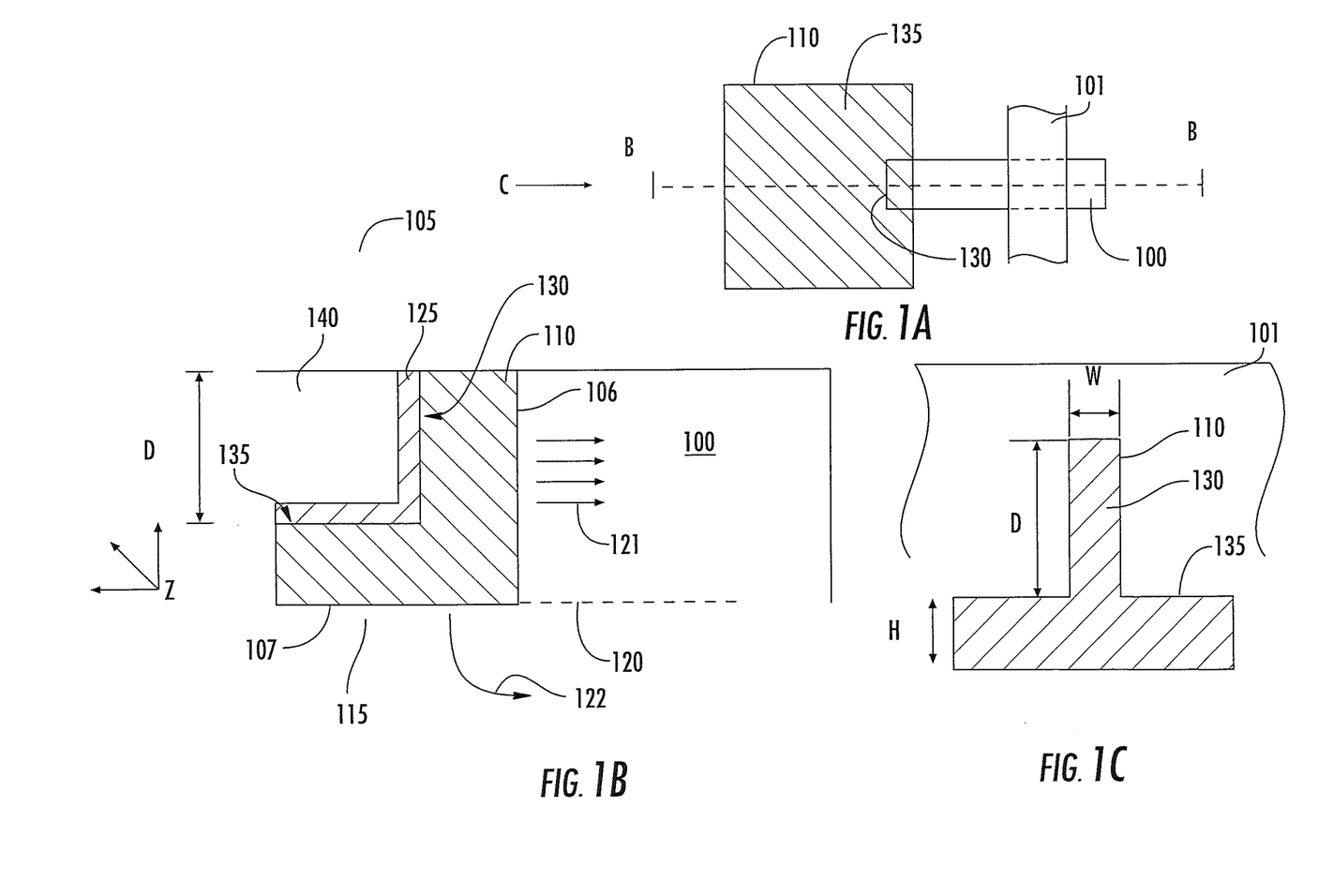
FIGS. 1A-C are a plan view, a cross-sectional view, and an end view, respectively, illustrating finFET devices having a fin structure including a high mobility semiconductor material and an adjacent recess including a remaining portion of a graded composition epi-grown semiconductor alloy material recessed to a depth "D" to provide a source/drain for the finFET device in some embodiments according to the invention.

FIGS. 1A-C include views illustrating a finFET device with a fin structure 100 including a high mobility semiconductor material and an adjacent recess 105 including a remaining portion of a graded composition epi-grown semiconductor alloy material 110 recessed to a depth "D" to provide a source/drain contact recess 140 on a source/drain region 115 for the finFET device in some embodiments according to the invention.

In some embodiments according to the invention, a metal-semiconductor alloy layer 125 can be formed on the alloy material 110 in the recess 140 and a metal can be deposited thereon to provide a contact to the source/drain region 115 and the channel region of the fin structure 100. A gate 101 can cross-over the fin structure 100 and can be used in operation of the finFET to control conduction of charge in the channel region. In some embodiments according to the invention, no recess 140 is formed within the alloy material 110.

The high mobility semiconductor material included in the fin structure 100 can be any semiconductor material that promotes increased mobility of majority carriers in the channel region that is provided for by the finFET structure 100. In some embodiments according to the invention, a component of the high mobility semiconductor material can be germanium (Ge) introduced into a silicon lattice to provide a fin structure including a high mobility semiconductor material such as SiGe. In some embodiments according to the invention, the only component of the high mobility semiconductor material included in the fin structure 100 is Ge, to provide a fin structure 100 including only Ge. In still other embodiments according to the invention, a component of the high mobility semiconductor material can be Gallium (Ga), which can be included in a lattice of Indium (In) and Arsenic (As) to provide InGaAs as the semiconductor material in the fin structure 100. It will be further understood that the high mobility semiconductor material included in the fin structure 100 can be a combination of different semiconductor materials in Groups III-V or II-VI.

It will be understood that in some embodiments according to the invention, the graded composition epi-grown semiconductor alloy material (i.e., alloy material) 110 can be an alloy of a component of the high mobility semiconductor material included in the fin structure 100 and at least one other semiconductor material. For example, in some embodiments according to the invention, where a component of the high mobility semiconductor material in the fin structure 100 is Ge, the graded composition epi-grown semiconductor alloy material 110 can be an alloy of Si and Ge (i.e., SiGe), the particular composition of which varies within the alloy material itself as a function of distance from, for example, where the graded SiGe alloy material contacts the SiGe (or Ge) channel. Still further, in some embodiments according to the invention, when a component of the high mobility semiconductor material included in the fin structure 100 is Ga, the alloy material 110 can be an alloy of In, As, and Ga (i.e., InGaAs) the particular composition of which varies within the alloy material itself as a function of distance from, for example, where the graded InGaAs alloy material contacts the InGaAs channel. Other semiconductor materials may also be used to provide the alloy.

Still further, it will be understood that in some embodiments according to the invention, the composition of the epi-grown semiconductor alloy material is graded as a function of the distance from the surface on which the semiconductor alloy material is epitaxially grown. For example, in some embodiments according to the invention, the composition of the alloy material 110 gradually changes as the epi-growth proceeds. In some embodiments according to the invention, the amount of a component of the high mobility semiconductor material included in the alloy material 110 decreases with the distance from vertical interface 106 to the fin structure 100. Similarly, the amount of a component of the high mobility semiconductor material included in the alloy material 110 also decreases with the distance from a horizontal interface 107 to the fin structure 100.

In some embodiments according to the invention, when the fin structure 100 includes a component of the high mobility semiconductor material being Ge in a Si lattice (i.e., SiGe), the alloy material 110 can be formed so that the composition thereof at the vertical interface 106 (or the horizontal interface 107) is substantially the same as that provided in the fin structure 100. However, the amount of Ge included in the alloy material 110 can be gradually reduced as the epi-growth proceeds until the amount of Ge reaches a minimum at an uppermost surface of the alloy material 110, where the metal-semiconductor alloy 125 can be formed.

In some embodiments according to the invention, when the fin structure 100 includes a component of the high mobility semiconductor material being Si in a Ge lattice (i.e., SiGe), the alloy material 110 can be formed so that the composition thereof at the vertical interface 106 (or the horizontal interface 107) is substantially the same as that provided in the fin structure 100. However, the amount of Si included in the alloy material 110 can be gradually reduced as the epi-growth proceeds until the amount of Si reaches a minimum at an uppermost surface of the alloy material 110, where the metal-semiconductor alloy 125 can be formed.

It will be understood, therefore, that the composition of the alloy material 110 can be rich in a component of the high mobility semiconductor material at the interface to the fin structure 100, but smoothly transitions to a lean composition of a component of the high mobility semiconductor material at the portion of the alloy material 110 where the metal-semiconductor alloy 125 may be formed.

The rich composition of the alloy material 100, at the interface to the channel, can be similar to that of the fin structure 100 to reduce the formation of defects during the epi-growth of the semiconductor alloy material 110. The lean composition of the alloy material 110, at the contact, can be such that a relatively low barrier height is formed with, for example, the metal-semiconductor alloy 125 (or metal contact 140 if the metal-semiconductor alloy 125 is not present). The graded composition of the epi-grown semiconductor alloy material 110 may avoid significant abrupt changes or discontinuities in the lattice structure of the alloy material 110 to promote both a low defect material as well as a low resistivity/low barrier height contact to the channel included in the fin structure 100.

In some embodiments, an additional component, but not of the high mobility semiconductor material, may be incorporated in the epi-grown semiconductor alloy material 110 at a particular point during the epi growth, and may not be incorporated in the epi-grown semiconductor alloy material 110 at another particular point during the epi growth, without introducing significant abrupt changes or discontinuities in the lattice structure of the alloy material 110.

Figure 2A:
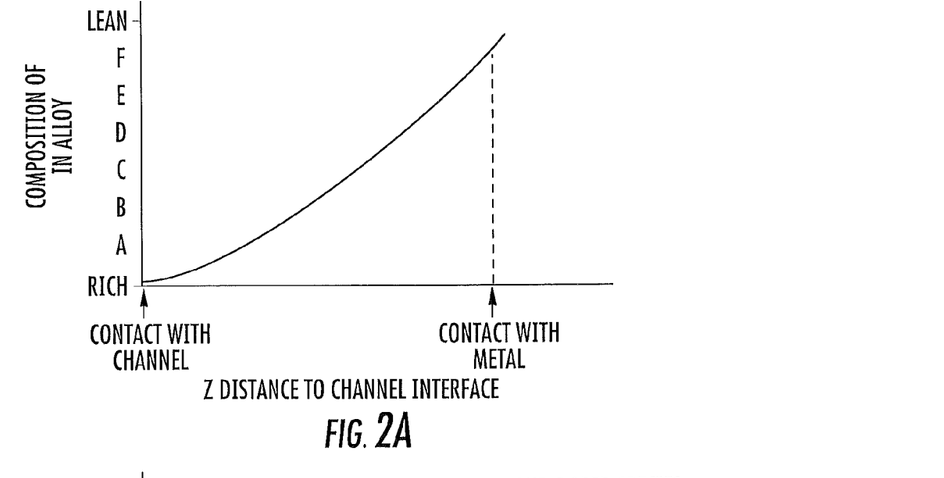
FIGS. 2A-C are graphs illustrating different composition profiles for the graded composition epi-grown semiconductor alloy material as a function of distance from the channel interface in some embodiments according to the invention.
Figure 2B:
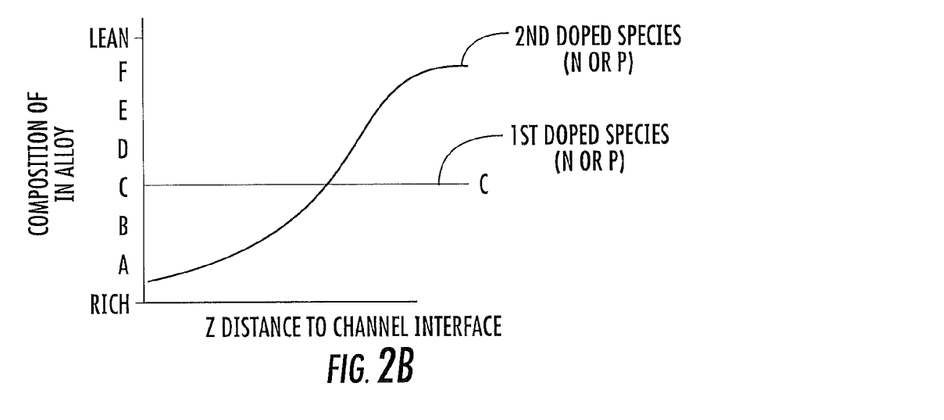
Figure 2C:
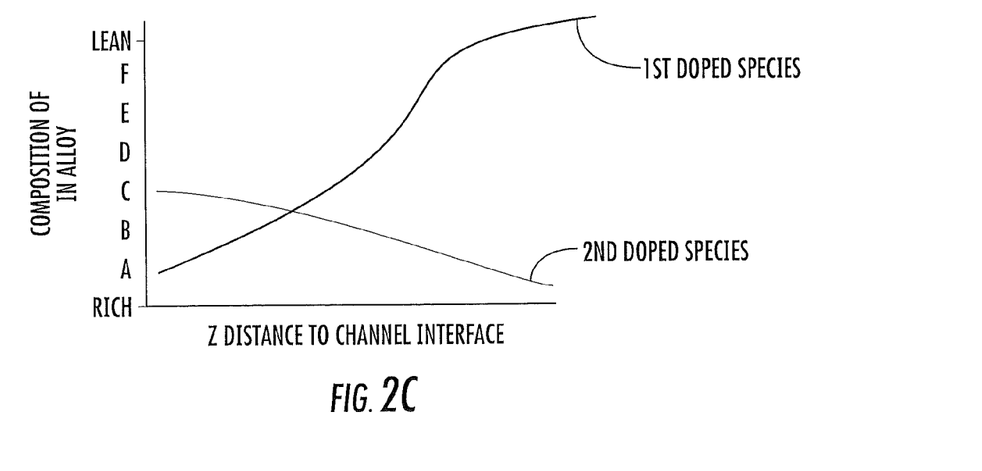
Figure 3:
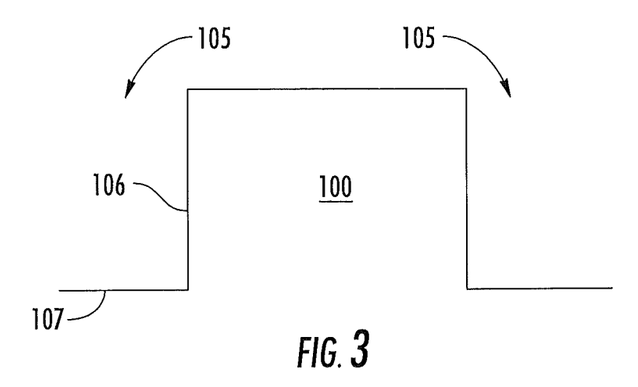
FIGS. 3, 4A, 4B, 5, 6, 7 and 8 are cross-sectional views illustrating methods of forming finFET devices having a fin structure including a high mobility semiconductor material and an adjacent recess including a remaining portion of a graded composition epi-grown semiconductor alloy material in some embodiments according to the invention.

FIGS. 2A-C are graphs illustrating different composition profiles for the alloy material 110 in some embodiments according to the invention. According to FIG. 2A, the profile for the alloy is shown as being rich in a component of the high mobility semiconductor material at, or close to, the channel interface (vertical 106 and horizontal 107) to the fin structure 100. Moreover, as the distance, z, is increased from the channel interface, the amount of a component of the high mobility semiconductor material included in the alloy 110 is gradually reduced until reaching a targeted lean composition at a point where the metal contact may be provided to the alloy material 110. For example, as shown in FIG. 2A, the amount of a component of high mobility semiconductor material in the alloy 110 gradually decreases as shown by gradations A-F as the distance z increases. It will be understood that although the concentrations A-F of a component of the high mobility semiconductor material in the alloy 110 can represent discrete levels, the transitions between these levels are gradual to avoid any significant abrupt changes in the lattice structure, which may help avoid the formation of defects in the alloy material 110 during epi-growth. It will be understood that other types of gradual changes from the rich to the lean composition of high mobility semiconductor material can be utilized, including linear and non-linear gradations.

In some embodiments according to the invention, the maximum change in the amount of a component of the high mobility semiconductor material included in the alloy 110 is about 1% per Å. In some embodiments according to the invention, the maximum change in the amount of a component of the high mobility semiconductor material included in the alloy 110 is less than 2% per Å. In some embodiments according to the invention, a component of the high mobility semiconductor material rich composition is within about 30% of being equal to that of a component of the high mobility semiconductor material included in the fin structure 100, whereas a component of the high mobility semiconductor material lean composition can be within about 0-25% of that of a component of the high mobility semiconductor material included in the fin structure 100. In other words, in some embodiments according to the invention, the rich composition may be provided by having slightly more or less of a component of the high mobility semiconductor material in the alloy 110 than what is included in the fin structure 100, whereas the lean composition can be at zero, but not necessarily equal to zero, and still provide many of the same benefits of other embodiments according to the invention.

FIGS. 2B and 2C show different profiles of graded composition of the alloy material 110 in some embodiments according to the invention that are different from those shown in FIG. 2A. As shown in FIG. 2B, the profile of the graded composition epi-grown semiconductor alloy material 110 can be different for different types of dopants used to form the source/drain 115. An alloy material 110 included in a device having a source/drain 115 that is doped with a first electrically active species (i.e., n- or p-type) can have a composition that is constant over the distance from the channel interface. In some embodiments, the composition that is constant has a component of the high mobility semiconductor material in the alloy 110 within about 30% of being equal to that of a component of the high mobility semiconductor material included in the fin structure 100. In contrast, however, a semiconductor alloy material 110 in a device having a source/drain 115 that is doped with a second electrically active species (i.e., n- or p-type) can have a graded composition as described, for example, in conjunction with FIG. 2A.

As shown in FIG. 2C, in some embodiments according to the invention, source/drains 115 having different types of dopants can have different alloy materials 110 formed thereon where each has a different graded composition profile. For example, a second doped species can be formed with a linear graded composition profile whereas the first doped species can be a non-linear graded profile. Other types of grading profiles may also be used in each of the embodiments described in FIGS. 2A-C.

FIGS. 3-8 are cross-sectional views illustrating the formation of finFET devices including graded composition epi-grown semiconductor alloy materials on the source/drains thereof in some embodiments according to the invention. According to FIG. 3, a fin structure 100 is formed of a fin material which can include a component of the high mobility semiconductor material, such as Ge, Ga, or other elements included in Groups II, III, IV, V, or VI. In particular, the fin structure 100 can be formed of Si combined with Ge as the high mobility semiconductor material to provide a fin structure 100 of SiGe. In still other embodiments according to the invention, the semiconductor material included in the fin structure 100 can be InGaAs, where Ga is the component of the high mobility semiconductor material included therein. The high mobility semiconductor material can be formed in the fin structure 100 using any process to provide the semiconductor material in the fin structure with any composition that provides a high mobility material for the finFET device.

Figure 4A:
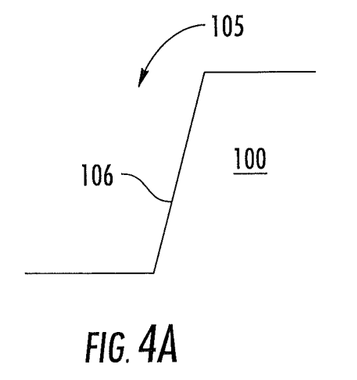
Figure 4B:
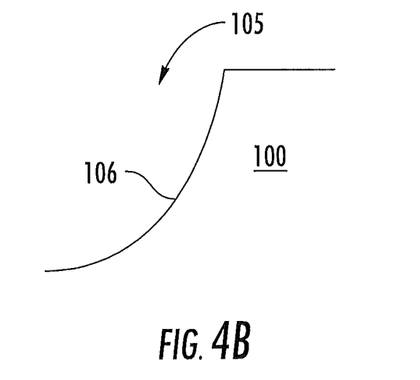

The fin structure 100 is formed to provide a recess 105 adjacent to the fin, which is partially defined by a vertical channel interface 106 and horizontal channel interface 107. It will be also understood that other types of geometry for the fin structure 100 may be defined such that the shape of the recess 105 is different from that shown in FIG. 3. For example, in FIGS. 4A and 4B, other shapes are provided for the recess 105 when forming the fin structure 100. In particular, FIG. 4A shows the fin structure 100 including a tapered vertical interface 106 and FIG. 4B shows a substantially curved interface 106 for the fin structure 100. Other shapes may also be provided for the vertical interface 106 and horizontal interface 107 as part of the fin structure 100.

Figure 5:
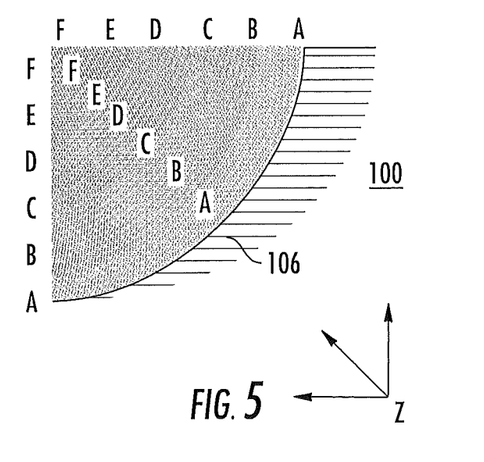

According to FIG. 5, the graded composition epi-grown semiconductor alloy material 110 is grown in the recess 105. For simplicity, only a portion of the epi-grown semiconductor alloy material 110 grown in the recess 105 is shown in FIG. 5. In particular, the alloy material 110 includes a component of the high mobility semiconductor material included in the fin 100. More specifically, in some embodiments, the composition of the alloy material 110 epi-grown at the interface 106 and interface 107 is the same as, or close to, that in the fin structure 100. For example, at the interface 106, the composition of the alloy material 110 may be rich in a component of the high mobility semiconductor material so that it matches, or is within 30% of, that included in the fin structure 100, such that when the semiconductor material included in the fin structure 100 is SiGe, the composition of the alloy 110 is configured relative to that included in the fin structure 100 to reduce the formation of defects at the interface 106 and interface 107.

As the epi-growth proceeds, however, the amount of a component of the high mobility semiconductor material included in the alloy 110 is gradually changed with the distance Z (measured relative to the interface 106 and to the interface 107). The gradation of the composition of the high mobility semiconductor material in the epi-grown semiconductor alloy material 110 is changed to gradually modify the amount of a component of the high mobility semiconductor material therein to avoid any significant abrupt changes in the composition which could otherwise increase the resistivity or result in the formation of defects in the alloy material 110. Still further, the targeted end composition for the alloy material 110 (i.e., the lean composition) is such that the amount of a component of the high mobility semiconductor material included in a portion of the alloy material 110 that is farthest from the interfaces 106 and 107 is configured to reduce the barrier height defined by the alloy material 110 and the metal-semiconductor alloy/metal contact formed thereon.

For example, in some embodiments according to the invention, when a component of the high mobility semiconductor material is Ge, and the material included in the fin structure 100 is SiGe, the composition of the alloy material 110 is such that the epi-growth provides for essentially a SiGe material in the source/drain at the interface 106 and the interface 107. However, as the distance Z increases away from the interfaces 106 and 107, the amount of Ge included in the alloy material 110 is gradually reduced to approach that of pure Si at the point which is farthest from each of the interfaces and where the metal-semiconductor alloy will be formed to promote a lower resistance contact to the channel in the fin structure 100.

The doped epitaxial SiGe can be grown using Dichlorosilane ($SiH_2Cl_2$) as the source of Si and germane ($GeH_4$) diluted (e.g. at 2% in $H_2$) as the source of Ge. Gaseous hydrochloric acid (HCl) can be added for selectivity. Diborane ($B_2H_6$) and phosphine ($PH_3$) diluted (e.g. at 2000 parts ppm) in $H_2$ can be used as the sources of B and P, respectively. Growth temperature can be in the 450 to 550 C range. Through the deposition, the composition of the SiGe alloy can be varied by changing the flow rates of the different gases, and specifically by changing the flow rates of Dichlorosilane and diluted Germane.

It will be further understood that, in some embodiments according to the invention, during the epitaxial growth of the alloy material 110, in-situ doping can be utilized to provide doping of the epi-grown semiconductor alloy material 110. Accordingly, if an n type finFET device is to be formed, an n-type dopant can be used for the in-situ doping of the source/drain semiconductor material whereas if a p type finFET device is to be formed, a p-type dopant can be used. In some embodiments according to the invention, the fin material may be implanted with dopants before the epi-growth of the alloy material 110. In some embodiments according to the invention, the implantation of dopants may take place after the epi-growth of the alloy material 110.

Figure 6:
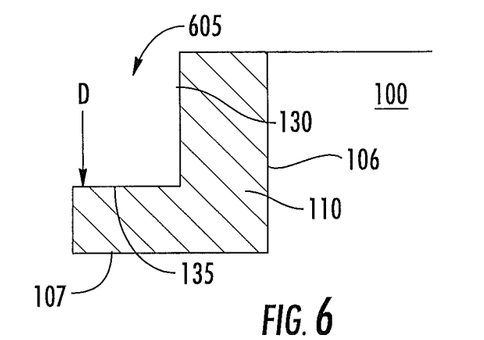

According to FIG. 6, in some embodiments according to the invention, the graded composition epi-grown semiconductor alloy material 110 is etched to provide a remaining portion thereof at a predetermined depth "D" forming a source/drain contact recess. In some embodiments, the graded composition epi-grown semiconductor alloy material 110 is only grown from the interfaces 106 and 107 to provide a portion at a predetermined depth "D" forming a source/drain contact recess. The depth D is predetermined to minimize the total resistance of the finFET device based on a predetermined barrier height value for the finFET device. For example, the predetermined barrier height value can be determined based on the combination of: the graded composition epi-grown semiconductor alloy material 110 used (e.g., SiGe), the particular metal used for the contact on the graded composition epi-grown semiconductor alloy material 110 (e.g., nickel), and the particular dopant concentration and type of dopant used for the source/drain region (i.e., n or p type).

It will be understood that the term "contact" can include the metal material formed in the recess on the uppermost surface of the graded composition epi-grown semiconductor alloy material 110, as well as a metal-semiconductor alloy that is generated using a reaction process with the graded composition epi-grown semiconductor alloy material 110. Accordingly, an interface having an associated contact (interface) resistivity can refer to the boundary where the metal material contacts the remaining portion of the graded composition epi-grown semiconductor alloy material 110.

The predetermined barrier height value can be compared to a predetermined barrier height threshold value to indicate whether the predetermined barrier height value for the finFET device is likely to provide a relatively high barrier height or a relatively low barrier height for the finFET device. If the predetermined barrier height value is determined to be relatively high (such as greater than about 300 meV) then the depth D of the remaining portion of the graded composition epi-grown semiconductor alloy material 110 can be reduced in anticipation that the lowest total resistance of the finFET will be achieved with a smaller value of D. In some embodiments according to the invention, a relatively high predetermined barrier height value can be greater than about 200 meV. In still other embodiments according to the invention, a relatively high predetermined barrier height value can be greater than about 100 meV.

In contrast, if the predetermined barrier height value is determined to be relatively low (such as less than or equal to about 100 meV) then the depth D of the remaining portion of the graded composition epi-grown semiconductor alloy material 110 may be larger in anticipation that the lowest total resistance of the finFET may be achieved with a greater value of D.

As a first example of predetermined n and p-type barrier heights, contacts to n-type or p-type Si formed with NiSi have barrier heights of about 0.6 eV for NMOS and about 0.5 eV for PMOS, respectively, with interface resistivity on the order of $10^{-8}$ ohm-$cm^2$. As a second example of a predetermined p-type barrier height, contacts to p-type Ge formed by any metal have a barrier height of about 0.1 eV with interface resistivity on the order of $10^{-9}$ ohm-$cm^2$.

As further appreciated by the present inventors, however, in cases where the predetermined barrier height is relatively low, simply increasing the depth D to which the graded composition epi-grown semiconductor alloy material 110 is recessed may actually increase the total resistance of the finFET device unless the depth D is limited to a point where beyond which an incremental decrease in a spreading resistance value for a horizontal portion of a source/drain contact in the recess provided by increased depth may be less than an incremental increase in total resistance due to the increase in the vertical portion of the source/drain contact. Accordingly, in some embodiments according to the invention, the depth may be limited to a value where the total resistance does not incrementally increase due to the increase in the vertical portion of the source/drain contact.

The above effect can be described by addressing the relationship of the different components of the total resistance to the different portions of a contact to the fin structure 100. Referring to FIG. 1B, for example, when a metal is formed in the recess 105 on the remaining portion of the graded composition epi-grown semiconductor alloy material 110, the contact can include a vertical portion 130 that faces the fin structure 100 and a horizontal portion 135. A current that is conducted into the fin structure 100 can be primarily determined based on the contact resistance component for the vertical portion 130 of the contact.

The vertical portion 130 can have a relatively small area due to the fact that the contact is formed to a relatively narrow cross-sectional area defined by the face of the fin structure 100 which the vertical portion 130 faces. Accordingly, even though the vertical portion 130 may have a vertical dimension of "D", the width "W" shown in FIG. 1C illustrates that the overall cross-sectional area can be small due to the narrow width of the fin structure 100.

By contrast, the current 122 that is conducted into the fin structure 100 from the horizontal portion 135 of the contact can be primarily determined based on the spreading resistance components for the horizontal portion 135 of the contact.

The above effects can be further described by noting that as the remaining portion of the graded composition epi-grown semiconductor alloy material 110 is further recessed, such that D increases, the area of surface 130 through which the current 121 flows increases. Similarly, as H decreases, the area of surface of height H and in the same plane as surface 130 through which current 122 flows in the channel decreases. For the case in which the contact (interface) resistivity $\rho_C$ is very high (>>1E-9 ohm-cm$^2$), the current 121 that passes through the vertical surface 130 is small in which case the total current flow will be primarily current 122 which is primarily determined by the spreading resistance and not by contact resistance. Thus, for the case in which $\rho_C$ is very high, as D increases and H decreases, the total current flow which is primarily comprised of current 122 thus decreases as D increases. For the case in which the which the contact (interface) resistivity $\rho_C$ is very low (<<1E-11 ohm-cm$^2$), the current 121 that passes through the vertical surface 130 can be large in which case the total current flow will be primarily current 121 which is primarily determined by the contact resistance and not by spreading resistance. Thus, for the case in which $\rho_C$ is very low, as D increases and H decreases, the total current flow which is primarily comprised of current 121 thus increases as D increases.

As appreciated by the present inventors, the recessed depth D can be tailored to a point where any further recessing may cause the total current to decrease, rather than increase, due to the value of contact (interface) resistivity, $\rho_C$. A mathematical relationship showing how this depth D can be determined, for the simple case in which current 121 is determined only by contact resistance, $\rho_C$, and current 122 is determined only by spreading resistance, $\rho_S$, is given by:

$$\sigma_{tot} = \frac{D}{\rho_{ch} + \rho_c} + \frac{H - D}{\rho_{ch} + \rho_{sp}(H - D)^2}$$

where $\rho_{CH}$ is the channel resistivity of the fin structure 100, $\sigma_{tot}$ is the total conductivity of the finFET device, and total current is proportional to $\sigma_{tot}$.

Figure 9A:
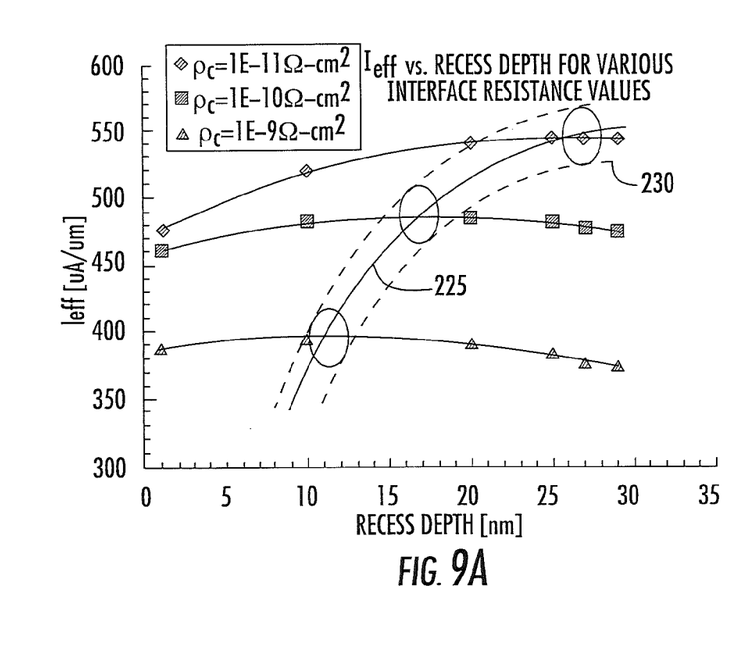
FIG. 9A is a graph illustrating a relationship between effective drive current and recess depth of the graded composition epi-grown semiconductor alloy material in some embodiments according to the invention.

FIG. 9A is a graph illustrating a relationship between effective current, similar to total current above, and recess depth in some embodiments according to the invention. In particular, effective finFET device current is plotted over a range of recess depths for three different contact (interface) resistivities: (A) 1×10$^{-11}$ ohm-cm$^2$, (B) 1×10$^{-10}$ ohm-cm$^2$, and (C) 1×10$^{-9}$ ohm-cm$^2$. As shown in FIG. 9A, in general, starting from a shallow recess depth on the left, the effective current increases as the recess depth increases. For example, Ieff of device (A) increases essentially continuously from the shallow portion to beyond 25 nm indicating that at such a low resistivity, Ieff, which is primarily comprised of current 121, thus increases essentially continuously as D increases.

In contrast, devices (B) and (C) both indicate that the effective current increases starting from the shallow recess depth on the left, and but actually stabilizes and is reduced as the recess is etched further. For example, the data for device (C) shows that at about 13 nm recessed depth, the effective current reaches a maximum value and thereafter decreases as the depth continues to increase. Furthermore, the data for device (B) shows that at about 17 nm recessed depth, the effective current reaches a maximum and thereafter begins to decrease as the recess is further etched. Therefore, for both devices (B) and (C), a particular recess depth can be determined given the particular interface resistivity for the device, beyond which the recess should not be etched further in order to avoid decreasing the effective current.

It will be further understood that although FIG. 9A shows data for only three devices at the illustrated range of recess depths, these relationships can be utilized to extrapolate or interpolate suitable recess depths for finFET devices having a predetermined interface resistivity (which as described herein can be related to the predetermined barrier height). For example, a segment 225 can be drawn to intersect each of the portions of the different curves at about the point where the recess depth results in the effective current reaching a maximum.

It will be further understood that as shown in FIG. 9A, the point at which the effective current reaches a maximum can be effectively defined to include a range of values 230 on either side of the maximum point such that any other finFET device having a predetermined resistivity can be plotted to intersect the segment 225 and thereby indicate the approximate location where the recess depth results in the maximum. In some embodiments according to the invention, the range of values on either side of the maximum point can be about ±10% of the recess depth at which the maximum is provided.

Figure 9B:
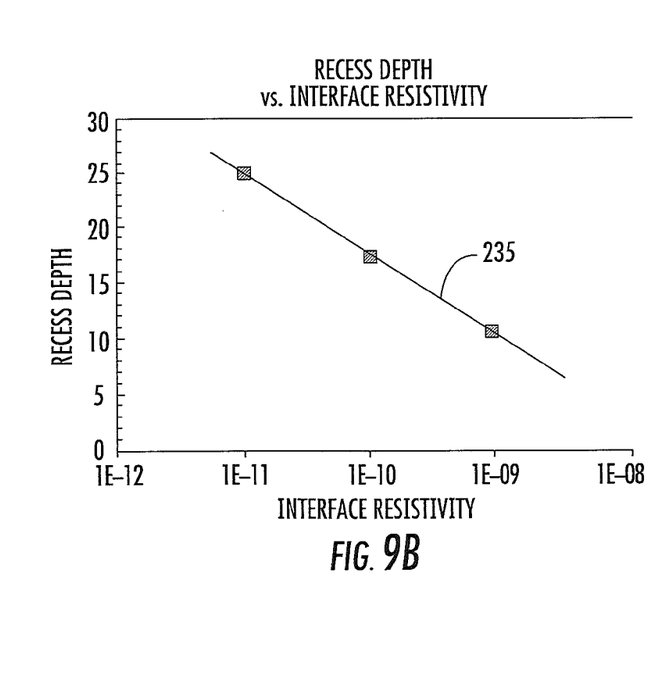
FIG. 9B is a graph illustrating a relationship between recess depth and interface resistivity of the graded composition epi-grown semiconductor alloy material in some embodiments according to the invention.

FIG. 9B is a graph illustrating a relationship between recess depth and interface resistivity in some embodiments according to the invention. In particular, FIG. 9B represents the same data shown in FIG. 9A but expresses the relationship between the interface resistivity and the recessed depth. For example, FIG. 9B shows the inversely proportional relationship between the recess depth and the interface resistivity such that as the interface resistivity decreases, the depth to which the recess may be formed to provide an increased Ieff increases.

Figure 7:
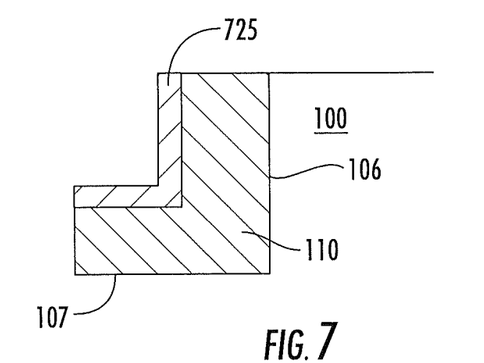
Figure 8:
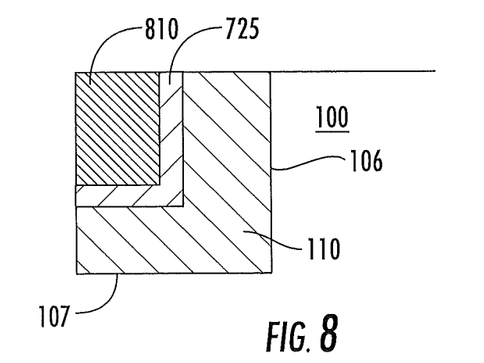

As shown in FIG. 7, the remaining portion of the alloy material 110 shown in FIG. 6 can be subjected to a self-aligned metal-semiconductor alloy process to form a metal-semiconductor alloy 725 on vertical and horizontal portions of the remaining semiconductor alloy material 110 to provide the contact for the finFET device in some embodiments according to the invention. Accordingly, the vertical portion and the horizontal portion will be understood to define the barrier height for the contact at the interface between metal-semiconductor alloy 725 and remaining portion of the semiconductor alloy material 110. In other words, in some embodiments according the invention, the metal-semiconductor alloy and the metal formed on the metal-semiconductor alloy be considered together to provide the contact to the finFET. According to FIG. 8, a metal-fill process can be used to deposit a metal 810 on the metal-semiconductor alloy 725 to form a contact 810 for the finFET device.

As described herein, the composition of an epi-grown semiconductor alloy material can be graded as a function of the distance from the surface on which the semiconductor alloy material is grown. For example, in some embodiments according to the invention, the composition of the alloy material 110 gradually changes as the epi-growth proceeds such that the amount of a component of the high mobility semiconductor material included in the alloy material 110 decreases with the distance from vertical interface 106 to the fin structure 100. Similarly, the amount of a component of the high mobility semiconductor material included in the alloy material 110 can also decrease with the distance from a horizontal interface 107 to the fin structure 100.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed:

1. A finFET device comprising:
   a high mobility semiconductor material in a fin structure, providing a channel region for the finFET device, wherein the high mobility semiconductor material includes any element from Group II through Group VI;
   a source/drain recess, adjacent to the fin structure; and
   a graded composition epi-grown semiconductor alloy material, including a component of the high mobility semiconductor material, in the source/drain recess, wherein the graded composition epi-grown semiconductor alloy material is graded as a function of a distance from a horizontal interface of the graded composition epi-grown semiconductor alloy material and the fin structure and as the function of a distance from a vertical interface of the graded composition epi-grown semiconductor alloy material and the fin structure, wherein the graded composition epi-grown semiconductor alloy material is graded in a first direction that is orthogonal to the horizontal interface and in a second direction that is orthogonal to the vertical interface.

2. The finFET device of claim 1 wherein an uppermost surface of the graded composition epi-grown semiconductor alloy material is recessed below an uppermost surface of the fin structure.

3. The finFET device of claim 2 further comprising:
   a source/drain contact recess in the graded composition epi-grown semiconductor alloy material, the source/drain contact recess having a depth that is limited to a point where beyond which an incremental decrease in a spreading resistance value associated with the horizontal interface is less than an incremental increase in the total resistance.

4. The finFET device of claim 2 further comprising:
   a metal-semiconductor alloy on the uppermost surface of the graded composition epi-grown semiconductor alloy material; and
   a metal on the metal-semiconductor alloy.

5. The finFET device of claim 1 wherein the graded composition epi-grown semiconductor alloy material comprises a high mobility semiconductor material rich composition contacting the high mobility semiconductor material of the fin structure at a channel interface and comprises a high mobility semiconductor material lean composition in the alloy farthest from the channel interface; and
   wherein an amount of the high mobility semiconductor material in the high mobility semiconductor material rich composition is greater than an amount of the high mobility semiconductor material in the high mobility semiconductor material lean composition.

6. The finFET device of claim 5 wherein the high mobility semiconductor material rich composition has a component equal to that of a component of the high mobility semiconductor material in the fin structure and the high mobility semiconductor material lean composition has a component about zero.

7. The finFET device of claim 5 wherein the high mobility semiconductor material rich composition has a component within +/−30% of being equal to that of a component in the high mobility semiconductor material in the fin structure and the high mobility semiconductor material lean composition has a component within 0-25% of that of a component of the high mobility semiconductor material.

8. The finFET device of claim 5 wherein the graded composition epi-grown semiconductor alloy material includes a decreasing composition of a component of the high mobility semiconductor material as a distance from the channel interface increases.

9. The finFET device of claim 1 wherein the graded composition epi-grown semiconductor alloy material comprises a maximum reduction in an amount of the high mobility semiconductor material in the alloy of about 2% per Angstrom.

10. The finFET device of claim 1 wherein a component of the high mobility semiconductor material in the fin structure comprises Ge or Ga and the graded composition epi-grown semiconductor alloy material comprises SiGe or InGaAs, respectively.

11. The finFET device of claim 1 wherein the finFET device comprises an N type finFET device having a first composition epi-grown semiconductor alloy material in the source/drain recess, finFET device further comprising:
    a P type finFET device including a second composition epi-grown semiconductor alloy material in a second source/drain recess.

12. The finFET device of claim 11 wherein the first and second composition epi-grown semiconductor alloy materials are graded differently.

13. The finFET device of claim 11 wherein the second composition epi-grown semiconductor alloy material is substantially constant throughout the second source/drain recess.

14. A finFET device comprising:
    a high mobility semiconductor material in a fin structure, providing a channel region for the finFET device, wherein the high mobility semiconductor material includes any element from Group II through Group VI;
    a source/drain recess, adjacent to the fin structure;
    a graded composition epi-grown semiconductor alloy material including a component of the high mobility semiconductor material in the source/drain recess, the alloy having an uppermost surface that is recessed below an uppermost surface of the fin structure, and including a high mobility semiconductor material rich composition contacting vertical and horizontal channel interfaces to the fin structure and including a high mobility semiconductor material lean composition farthest from the horizontal and vertical channel interfaces in the alloy material, wherein an amount of the high mobility semiconductor material in the high mobility semiconductor material rich composition is greater than an amount of the high mobility semiconductor material in the high mobility semiconductor material lean composition;
    a source/drain contact recess in the graded composition epi-grown semiconductor alloy material; and
    a metal in the source/drain contact recess, wherein the graded composition epi-grown semiconductor alloy material is graded in a first direction that is orthogonal to the horizontal interface and in a second direction that is orthogonal to the vertical interface.

15. The finFET device of claim 14 wherein the graded composition epi-grown semiconductor alloy material comprises a maximum reduction in an amount of the high mobility semiconductor material of about 2% per Angstrom.

16. The finFET device of claim 14 wherein the source/drain contact recess comprises a depth that is limited to a point where beyond which an incremental decrease in a spreading resistance value associated with the horizontal interface is less than an incremental increase in the total resistance.

\* \* \* \* \*